United States Patent
Paakkinen et al.

(10) Patent No.: US 11,993,479 B2
(45) Date of Patent: May 28, 2024

(54) METHOD FOR REDUCING THERMAL STRESS OF A POWER SEMICONDUCTOR SWITCH, AN ELECTRICAL CONVERTER UNIT AND AN ELEVATOR

(71) Applicant: KONE Corporation, Helsinki (FI)

(72) Inventors: Mikko Paakkinen, Helsinki (FI); Lauri Stolt, Helsinki (FI); Tuukka Kauppinen, Helsinki (FI)

(73) Assignee: KONE Corporation, Helsinki (FI)

( * ) Notice: Subject to any disclaimer, the term of this patent is extended or adjusted under 35 U.S.C. 154(b) by 283 days.

(21) Appl. No.: 17/672,150

(22) Filed: Feb. 15, 2022

(65) Prior Publication Data
US 2022/0169479 A1 Jun. 2, 2022

Related U.S. Application Data (63) Continuation of application No. PCT/EP2019/074213, filed on Sep. 11, 2019.

(51) Int. Cl.
| | |
|---|---|
| H02K 11/00 | (2016.01) |
| B66B 1/28 | (2006.01) |
| B66B 1/30 | (2006.01) |
| H02H 3/04 | (2006.01) |
| H02H 7/08 | (2006.01) |
| H02P 6/08 | (2016.01) |

(52) U.S. Cl.
CPC ............. *B66B 1/308* (2013.01); *B66B 1/285* (2013.01); *H02P 6/085* (2013.01)

(58) Field of Classification Search
CPC .......... B66B 1/308; B66B 1/285; H02P 6/085
USPC .............................................. 318/490, 400.12
See application file for complete search history.

(56) References Cited

U.S. PATENT DOCUMENTS

| | | | |
|---|---|---|---|
| 10,075,065 B2* | 9/2018 | Marcinkiewicz | ....... H02M 1/32 |
| 10,770,966 B2* | 9/2020 | Marcinkiewicz | ....... H02M 1/32 |
| 2011/0056771 A1 | 3/2011 | Ohya et al. | |

FOREIGN PATENT DOCUMENTS

JP 2002-125362 A 4/2002

* cited by examiner

*Primary Examiner* — Erick D Glass
(74) *Attorney, Agent, or Firm* — Birch, Stewart, Kolasch & Birch, LLP (57) ABSTRACT

An electrical converter unit and a method for reducing thermal stress of a power semiconductor switch, such as an IGBT, of an electrical converter unit, the electrical converter unit comprising at least a gate control circuit wherein the electrical converter unit controls an electrical motor. The method comprises determining load and estimating required motor current based on the determined load and/or a predetermined speed profile. The electrical converter unit has at least a first operating state and a second operating state. The second operating state is used if predetermined criteria is fulfilled, the predetermined criteria relating to at least one of the following: estimated required current, measured motor speed, temperature of the power semiconductor switch and/or electrical converter unit, temperature model of the power semiconductor switch and/or electrical converter unit. In the second operating state a lower switching frequency of the power semiconductor switch is used than in the first operating state, and in the second operating state a higher switching speed of the power semiconductor switch is used than in the first operating state.

28 Claims, 6 Drawing Sheets

METHOD FOR REDUCING THERMAL STRESS OF A POWER SEMICONDUCTOR SWITCH, AN ELECTRICAL CONVERTER UNIT AND AN ELEVATOR

CROSS REFERENCE TO RELATED APPLICATIONS

This application is a Continuation of PCT International Application PCT/EP2019/074213, filed on Sep. 11, 2019, which is hereby expressly incorporated by, reference into the present application.

FIELD OF THE INVENTION

The present invention relates in general to power semiconductor switches such as IGBTs. In particular, however not exclusively, the present invention concerns reducing thermal stress of a power semiconductor switches.

BACKGROUND

Electrical converter units and control systems are used to control electrical motors. These units and control systems are used to control motor speed and torque by e.g. varying motor input frequency and voltage. There are different requirements for electrical converter units and control systems in different kinds of environments.

Characteristic e.g. for elevator environment is high required current during acceleration in relation to required current in nominal speed. In elevator environment it's desired that the acceleration is done smoothly. In these kinds of circumstances the phase current of the motor is concentrated mostly on one switch of the inverter bridge in the beginning of the acceleration. Concentration of the current causes big change in temperature of terminals of the that specific switch. As the temperature of the terminals change, a mechanical stress is caused to the material interfaces of the component by differences of the coefficients of thermal expansion. Mechanical stress eventually leads to stress fractures in the interfaces.

In the elevator environment the above-mentioned problem is the worst when the elevator car is fully loaded, and it's lifted. If also travel height during the drive remains short, the duration of the acceleration current is longer than the current during the nominal drive.

The magnitude of electromagnetic interference (EMI) caused by the inverter relates to with which switching frequency and which switching speed the power semiconductors are switched on. To minimize the losses semiconductors should be controlled with a low switching frequency and a high switching speed. Low switching frequency has a positive effect on EMI but negative effect on noise produced by the motor. High switching speed has a negative impact on the EMI produced by the system.

There are known solutions for reducing effects of thermal stress of power semiconductor switches. In prior art systems the stress caused by heat cycle is reduced by dimensioning the semiconductors so that they can tolerate certain number of accelerations. This solution based on dimensioning is straightforward, but the bigger the semiconductors are, the bigger are also the switching losses of the semiconductors. In bipolar components like IGBTs the connection voltage stays the same and primarily resistive part is reduced. So, to simplify, with this kind of solution the losses stay essentially similar, but they are spread to larger area. The problem with this kind of solution is that increasing the area of the semiconductor increases also the component price.

According to another known solution, the switching frequency can also be altered so that with low speed of the motor, i.e. in the beginning of the acceleration and in the end of deceleration, a smaller switching frequency is used whereas in other situations the switching frequency is higher. The problem with this approach is that the changes in switching frequency can be sensed easily. The lower the switching frequency is, the more disturbing the noise is experienced.

SUMMARY

An objective of the present invention is to provide a solution reducing thermal stress of power semiconductors.

The objectives of the invention are reached by a method, an electrical converter, and an elevator unit as defined by the respective independent claims.

Differing from the prior art solutions, in the solution of this invention, the temperature change in semiconductor switches is reduced by decreasing losses of the semiconductor switches, e.g. IGBTs, based on predefined criteria. This way the temperature change reduction function of semiconductor switches can be activated only when it's needed.

According to a first aspect, a method for reducing thermal stress of power semiconductors, such IGBTs, is provided. The method comprises determining load and estimating required motor current based on the determined load and/or a predetermined speed profile. The electrical converter unit has at least a first operating state and a second operating state wherein the second operating state is used if predetermined criteria is fulfilled, the predetermined criteria relating to at least one of the following: estimated required current, measured motor speed, temperature of the power semiconductor switch and/or electrical converter unit, temperature model of the power semiconductor switch and/or electrical converter unit. In the second operating state a lower switching frequency of the power semiconductor switch is used than in the first operating state, and in the second operating state a higher switching speed of the power semiconductor switch is used than in the first operating state.

According to a second aspect, an electrical converter unit is provided. The electrical converter unit is configured at least to perform the method according to the first aspect or any embodiment thereof.

The electrical converter unit may, thus, comprise at least a power semiconductor switch, such as an IGBT, and a gate control circuit, wherein the electrical converter unit is configured to determine load and to estimate required motor current based on the determined load and/or a predetermined speed profile. The electrical converter unit has at least a first operating state and a second operating state. The electrical converter unit is configured to use the second operating state if predetermined criteria is fulfilled, the predetermined criteria relating at least one of the following: to estimated required current, measured motor speed, temperature of the power semiconductor switch and/or electrical converter unit, temperature model of the power semiconductor switch and/or electrical converter unit. The electrical converter unit is configured to use a lower switching frequency of the power semiconductor switch in the second operating state than in the first operating state, and a higher switching speed of the power semiconductor switch in the second operating state than in the first operating state.

According to a third aspect, an elevator is provided. The elevator comprises an elevator car, an elevator motor configured to move the elevator car, an electrical converter unit for operating the elevator motor and a control unit configured at least to perform the method according to the first aspect or any embodiment thereof.

In various embodiments, the electrical converter unit may comprise a converter device, such as a frequency converter or an inverter.

In one embodiment of the invention the second operating state is used if motor speed is below certain predetermined threshold value and estimated required current value is above certain predetermined threshold value.

In one embodiment of the invention the internal temperature of the power semiconductor switch and/or electrical converter unit is measured and/or modelled, and the operating state is changed from first state to the second state if, in addition to the predefined motor speed and predefined estimated required current value, a certain measured and/or modelled temperature threshold limit is reached.

In one embodiment of the invention the internal temperature of the power semiconductor switch and/or electrical converter unit is measured and/or modelled, the operating state is changed from first state to the second state only if a certain measured and/or modelled temperature threshold limit is reached regardless of the motor speed and estimated required current value.

In one embodiment of the invention the operating state is changed from first state to the second state when drive is started, preferably with high load, and motor speed is low and/or when motor is decelerated and the motor speed is low. The operating state can be changed from first state to the second state e.g. when drive is started with a load higher than a predefined load value, and motor speed is low or below a predefined speed and/or when motor is decelerated and the motor speed is low or below a predefined speed.

In one embodiment of the invention the electrical converter unit comprises a first gate resistor value, a second gate resistor value and means for switching between the first gate resistor value and the second gate resistor value, wherein the first gate resistor value is higher than the second gate resistor value.

In one embodiment of the invention the switching speed of the power semiconductor switch is increased by using lower gate resistor value of the power semiconductor switch.

In one embodiment of the invention the second resistor value is used in the second operating state and the first resistor value is used in the first state.

In one embodiment of the invention the electrical converter unit comprises a first gate control voltage, a second gate control voltage and means for switching between the first gate control voltage and the second gate control voltage, wherein the first gate control voltage is lower than the second gate control voltage.

In one embodiment of the invention switching speed of the power semiconductor switch is increased by increasing gate control voltage of the power semiconductor switch.

In one embodiment of the invention the first gate control voltage is used in the first operating state, and the second gate control voltage is used in the second operating state.

In one embodiment of the invention the electric motor is an elevator motor of an elevator.

In various embodiments, the electric motor may be one of the following: a synchronous reluctance motor, a permanent magnet motor, a permanent magnet linear motor, a permanent magnet assisted synchronous reluctance motor, a linear switched reluctance motor.

The present invention provides advantages over prior art solutions. With the solution of the invention a significant reduction of amplitude of the thermal cycle can be achieved. Reducing the switching frequency at the same time compensates EMI-level increased by the higher switching speed.

If selecting the operating mode with the reduced thermal stress would rely only on measurement of current and speed of the motor, the semiconductor component could create losses and get warm in the beginning of the acceleration before the appropriate operating mode reducing thermal stress could be selected. For this reason, it's advantageous to predict the acceleration and/or deceleration and select the operating mode based at least in part on predicted acceleration, deceleration and/or required motor current.

The method of the invention can be used in different cyclical applications in addition to elevators. The method of the invention can also be used for example to widen the operating temperature range of a frequency converter, by e.g. adding an internal temperature measurement and/or temperature model of a power semiconductor switch, such as an IGBT, to logic of the frequency converter which are used in overheating protection of the frequency converter. The decision to use temperature stress reducing function, i.e. second operating mode, according to some embodiments of the present invention can be based in some applications only to temperature measurement and/or temperature model. An example of these kind of applications are pumps and blowers.

Also, in elevator environment temperature measurement and/or estimated temperature of temperature model of a switch, such as an IGBT chip temperature, can be used in some embodiments of the invention. For example, when the temperature of the operating environment is low, it might not be necessary to reduce the temperature stress if the estimated increase in the chip temperature would stay low.

Various other advantages will become clear to a skilled person based on the following detailed description.

The expression "a number of" may herein refer to any positive integer starting from one (1), that is being at least one.

The expression "a plurality of" may refer to any positive integer starting from two (2), respectively, that is being at least two.

The terms "first", "second" and "third" are herein used to distinguish one element from another element, and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in depending claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Figure 1A:
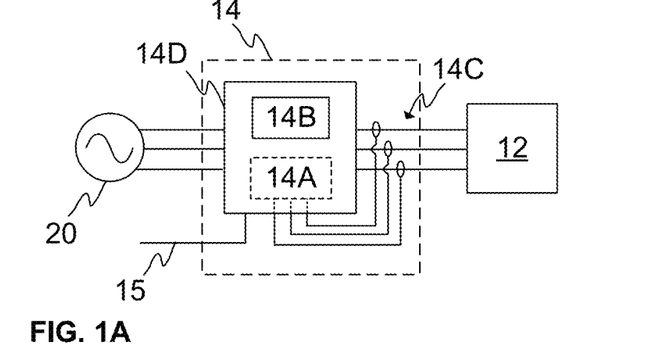
FIGS. 1A-1C illustrate schematically electrical converter units according to some embodiments of the present invention.

FIG. 1A illustrates schematically an electrical converter unit 14 according to an embodiment of the present invention. The electrical converter unit 14 may comprise a frequency converter or an inverter, or, specifically, the power conversion circuit(s) 14B thereof. Furthermore, the electrical converter unit 14 may comprise current determination means 14C and/or voltage determination means (not shown) for determining current(s) flowing into or out of the electric motor 12, such as three instantaneous phase currents, or voltages present between the motor phases or between motor phase and the ground/reference/neutral potential, such as a star point of the motor 12, respectively. The current determination means 14C and/or the voltage determination means may, preferably, be arranged in connection with the control unit 14A for providing information about said current(s)/voltages to the control unit 14A. Preferably, the electrical converter unit 14 may be configured at least to control said current(s)/voltage(s) in normal operating conditions for controlling the operation of the motor 12, such as rotation or movement of the rotor of the motor 12.

Figure 3:
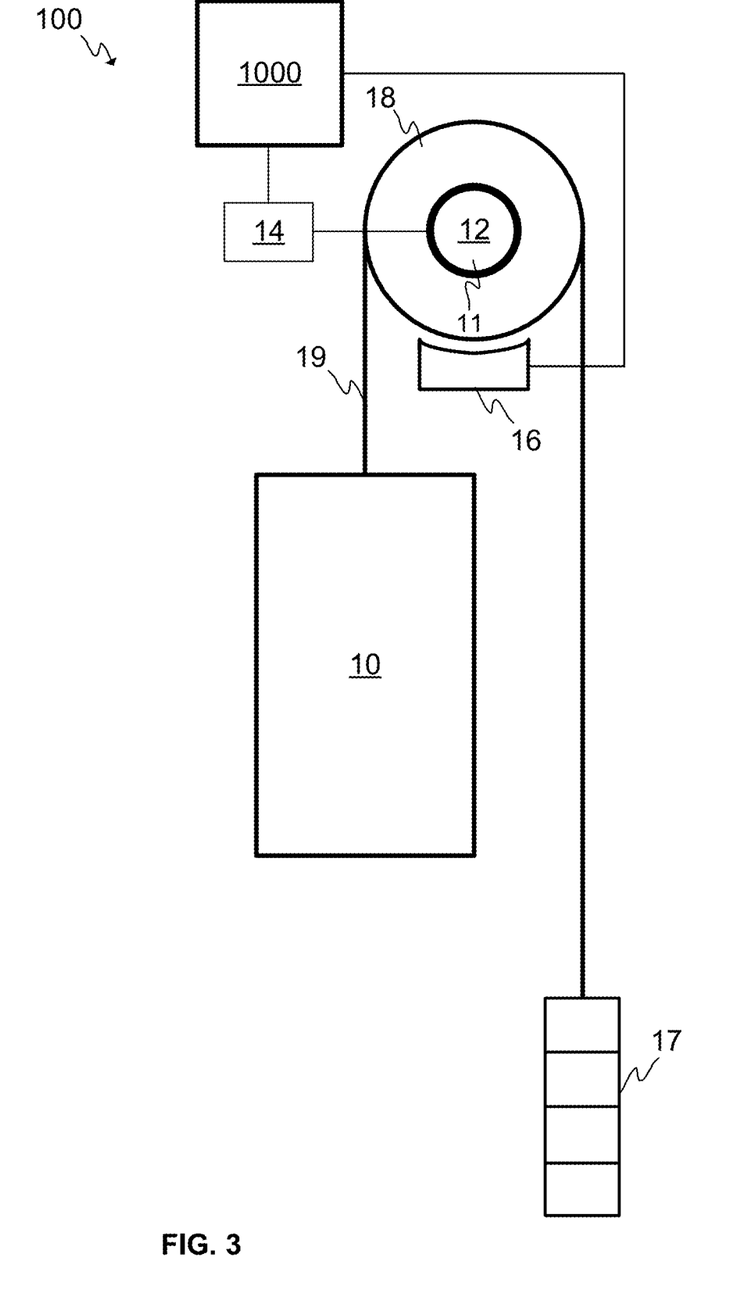
FIG. 3 illustrates schematically an elevator according to an embodiment of the present invention.
Figure 4:
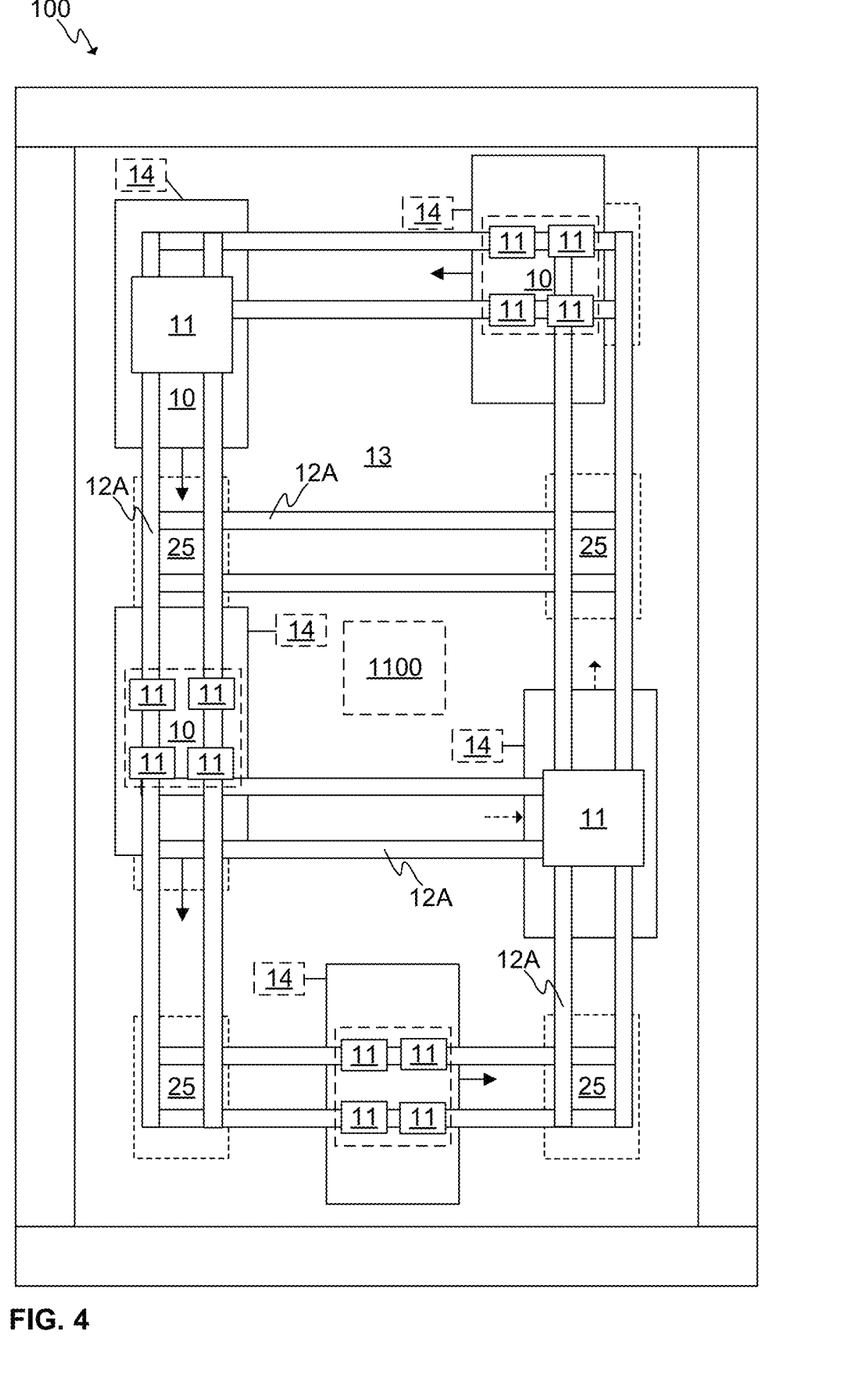
FIG. 4 illustrates schematically an elevator according to an embodiment of the present invention.

Furthermore, the electrical converter unit 14 may comprise a control unit 14A arranged closely, such as inside the same housing, with the converter device 14D, such as a frequency converter or an inverter, comprising power conversion circuit(s) 14B thereof. There may also be arranged an external connection 15 to the electrical converter unit 14 for providing, for example, measurement(s), control signal(s) and/or electrical power, from an external system in connection with the electrical converter unit 14, or specifically with the control unit 14A thereof. The external system may be, for example, a vehicle, an industrial process, or an elevator such as shown in FIGS. 3 and 4.

Figure 1B:
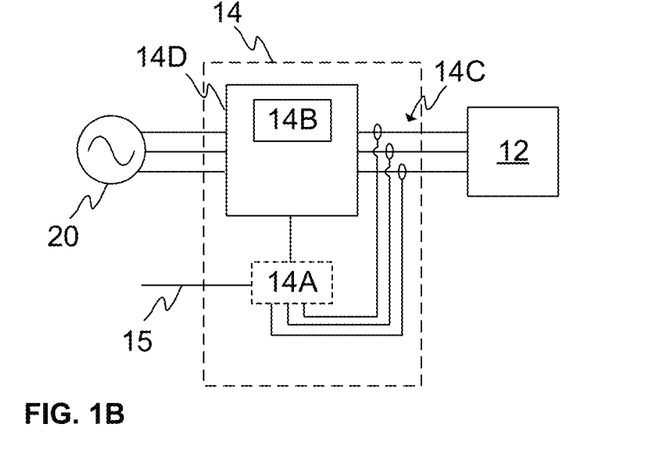

FIG. 1B illustrates schematically an electrical converter unit 14 according to an embodiment of the present invention. The electrical converter unit 14 in FIG. 1B is otherwise similar to one shown in and described with respect to FIG. 1A except that the control unit 14A is arranged separately with respect to the converter device 14D, such as outside the housing thereof. The control unit 14A may, thus, be arranged merely to be in connection with conversion circuit(s) 14B. The control unit 14A may be, for example, part of the controlling unit of the external system comprising the electrical converter unit 14.

Figure 1C:
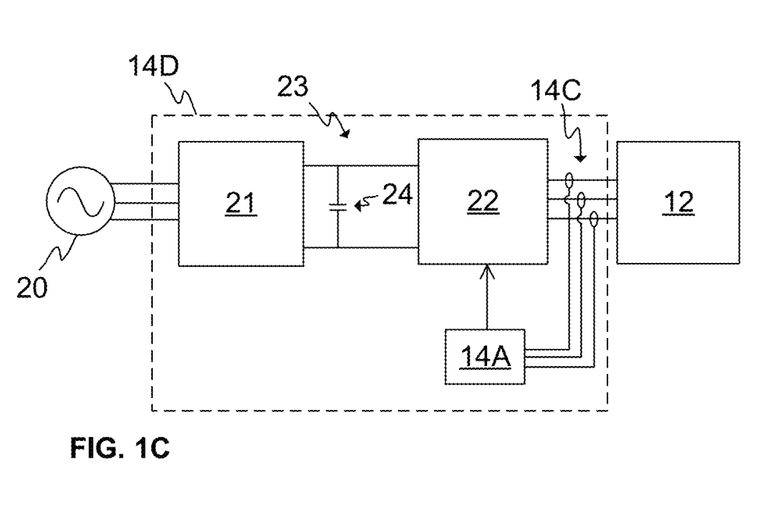

FIG. 1C illustrates schematically an electrical converter unit 14 according to an embodiment of the present invention. In FIG. 1C, an electrical converter unit 14 may comprise a frequency converter with an energy storage 24, such as a capacitor (bank) or a battery, arranged to the intermediate circuit 23 thereof, or in case of battery, at least in connection with the intermediate circuit 23. The frequency converter may be arranged to supply electrical power between the electrical network 20 and the electric motor 12. The frequency converter may comprise a load bridge 22 which is connected to the electric motor 12 for supplying electrical power between the electric motor 12 and the load bridge 22. The load bridge 22 may comprise controllable solid-state switches, such as forming power conversion circuit of a three-phase two- or three-level inverter. The supply voltage of the electric motor 12 may be formed by controlling the solid-state switches of the load bridge 22 with the control unit 14A of the load bridge 22 with, for example, pulse-width modulation (PWM) technique. The frequency converter may comprise current 14C and/or voltage determination means, such as current or voltage sensors, which may be arranged to be in connection with supply cables of the stator winding of the motor 12 for measuring the stator currents and/or voltages.

The electrical converter unit 14 as described hereinabove with respect to FIGS. 1A-1C may be configured to control the operation of the electric motor 12, for example, by a field-oriented control or vector control method as is known to a person skilled in the art.

In various embodiments of the present invention, the electrical converter unit 14, or specifically the control unit 14A thereof, illustrated in any of FIGS. 1A-1C and described in connection with said figures, may be configured to perform at least one embodiment of the method according to the present invention.

Thus, in various embodiments, the control unit 14A may comprise at least a processing unit, such as a processor or a microcontroller, for, for example, performing calculations and/or executing computer program code, and a memory for storing such code, measurement data, etc.

In various embodiments, the electric motor 12 may be one of the following: a synchronous reluctance motor, a permanent magnet motor, a permanent magnet linear motor, a permanent magnet assisted synchronous reluctance motor, a linear switched reluctance motor.

Figure 2:
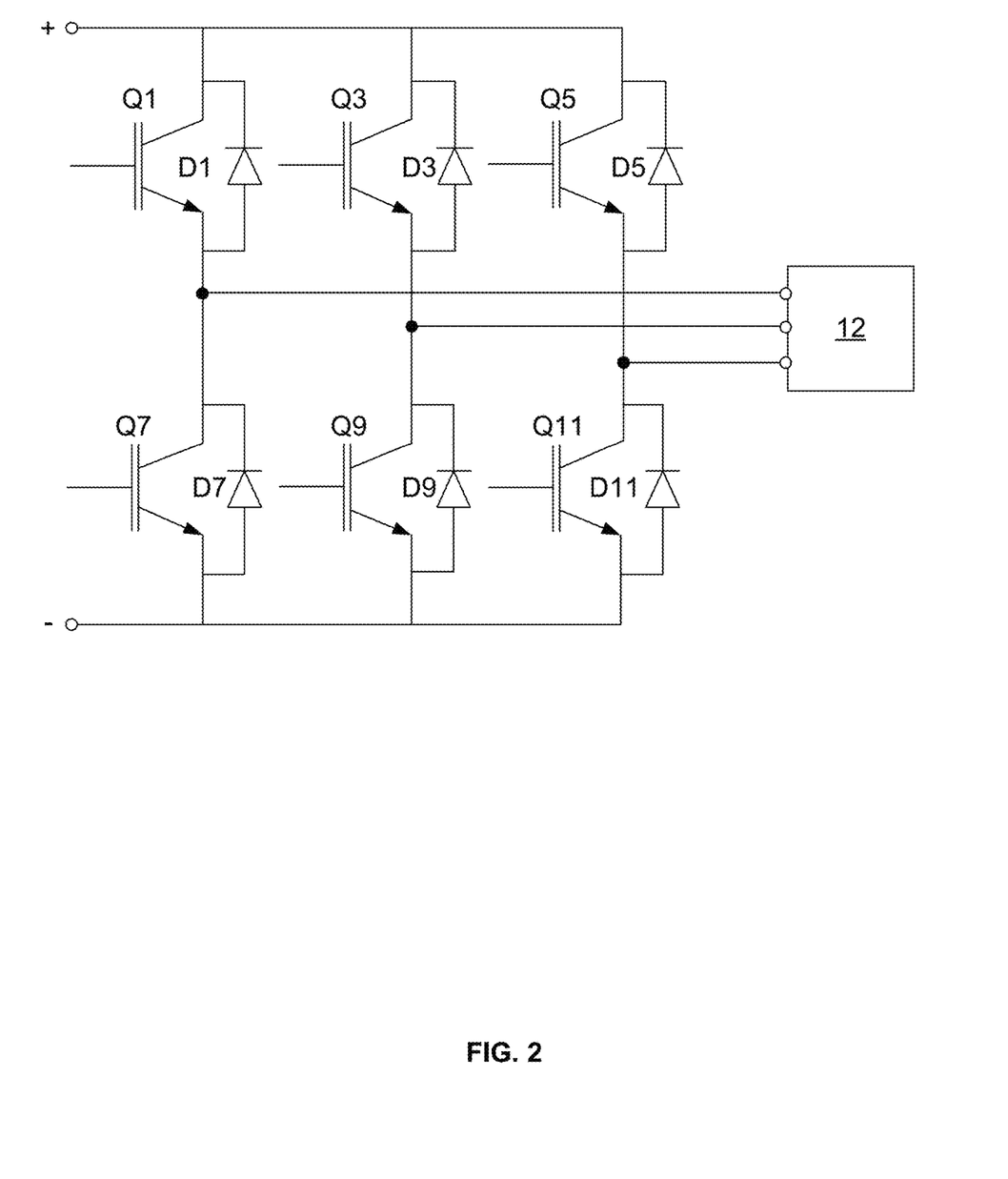
FIG. 2 illustrates schematically an exemplary implementation of certain parts of the electrical converter unit according to an embodiment of the present invention.

The converter unit 14 may comprise a converter device 14D, for example, a frequency converter or an inverter, such as including solid-state semiconductor switches, FIG. 2 illustrates schematically an exemplary implementation of controllable solid-state switches of the load bridge. The switches may be, for example, insulated-gate bipolar transistors (IGBT) or silicon carbide junction field-effect transistors. In an embodiment, a control unit of the load bridge 22 (see FIG. 1C) of the electrical converter unit 14, for instance, controls the solid-state switches of the load bridge according to the solution of the present invention, in which first operating state and second operating state are used. The load bridge of the FIG. 2 is a load bridge of a two-level converter. The present invention is not limited only for two-level converters, but it can be applied also to higher voltage level converters.

The load bridge (inverter) is configured to invert the intermediate-circuit direct voltage to e.g. a three-phase alternating voltage of variable frequency. The frequency converter may feed e.g. a three-phase alternating-current motor. The inverter may comprise for example six diodes D1, D3, D5, D7, D9, D11 and six IGBTs Q1, Q3, Q5, Q7, Q9, Q11 as in the example of FIG. 2. The inverter connects each motor phase either to the negative or the positive pole of the DC bus according to a certain order. The desired amplitude and frequency of the AC voltage supplied to the motor can be achieved e.g. by adjusting the width and the number of voltage pulses.

As described earlier, characteristic for example in elevator environment is high required current during acceleration in relation to required current in nominal speed. In these kinds of circumstances, the phase current of the motor is concentrated mostly on one switch of the inverter bridge in the beginning of the acceleration. Concentration of the current causes big change in temperature of terminals of that specific switch. As the temperature of the terminals change, a mechanical stress is caused to the material interfaces of the component by differences of the coefficients of thermal expansion. Mechanical stress can eventually lead to stress fractures in the interfaces. With the help of the present invention the stress on these components can be reduced.

FIG. 3 illustrates schematically an elevator 100 according to an embodiment of the present invention. The elevator 100 may comprise an elevator car 10 coupled to a counterweight 17 via a rope 19, a belt or similar. The rope 19, or similar, may travel around a drive sheave 18 into which an electric motor 12 is configured to generate a force to the drive sheave 18 for causing the elevator car 10 to move in response to an operation of the electric motor 12. Specifically, the elevator car 10 may be arranged to move in response to movement, such as rotation, of the rotor 11 of the motor 12.

At least one elevator brake 16, that is one, two or several, may be arranged so that when controlled by de-energizing, it is configured to meet the drive sheave 18 and, in that manner, to brake a movement of the motor 12, particularly the rotor 11 thereof, and, thus, the elevator car 10 or to keep elevator car 10 standstill in the shaft. When the brake 16 is energized, the brake 16 opens, thus allowing the movement of elevator car 10. The elevator 100 may alternatively be implemented without the counterweight 17. The motor 12 may alternatively be in a form of a linear motor, having a stator which extends along the elevator shaft and a rotor, or "mover", coupled to the elevator car 10, as shown in FIG. 4.

The elevator 100 may comprise an elevator control unit 1000 for controlling the operation of the elevator 100. The elevator control unit 1000 may be a separate device or may be comprised in the other components of the elevator 100 such as in or as a part of the electrical drive 14. The elevator control unit 1000 may also be implemented in a distributed manner so that, for example, one portion of the elevator control unit 1000 may be comprised in the electrical drive 14, such as control unit 14A thereof, and another portion in the elevator car 10. The elevator control unit 1000 may also be arranged in distributed manner at more than two locations or in more than two devices.

The elevator control unit 1000 and/or the control unit 14A may comprise one or more processors, one or more memories being volatile or non-volatile for storing portions of computer program code and any data values and possibly one or more user interface units. The mentioned elements may be communicatively coupled to each other with e.g. an internal bus.

The processor of the elevator control unit 1000 and/or the control unit 14A may at least be configured to implement at least some method steps of the present invention. The implementation of the method may be achieved by arranging the processor to execute at least some portion of computer program code stored in the memory causing the processor, and thus the elevator control unit 1000 and/or the control unit 14A, to implement one or more method steps of the present invention. The processor may thus be arranged to access the memory and retrieve and store any information therefrom and thereto. For sake of clarity, the processor herein refers to any unit suitable for processing information and control the operation of the elevator control unit 1000 and/or the control unit 14A, among other tasks. The operations may also be implemented with a microcontroller solution with embedded software. Similarly, the memory is not limited to a certain type of memory only, but any memory type suitable for storing the described pieces of information may be applied in the context of the present invention.

FIG. 4 illustrates schematically an elevator 100 according to an embodiment of the present invention. The elevator 100 may comprise at least one or a plurality of elevator cars 10 moving in the elevator shaft 13 or the elevator car pathway 13. The elevator car(s) 10 may comprise an electrical converter unit 14, such as comprising a converter device 14D, for example, a frequency converter or an inverter, and/or a second energy storage such as a battery or batteries. The electrical converter unit 14 may be utilized for operating a mover 11 arranged to the elevator car 10 for moving the car 10 along the elevator shaft 13. There may also be other electrically operated equipment in the elevator car 10 such as lighting, doors, user interface, emergency rescue equipment, etc. The electrical converter unit 14 or a further converter, such as an inverter or a rectifier, may be utilized for operating one or several of said other equipment of the elevator car 10. The second energy storage may, preferably, be electrically coupled to the electrical converter unit 14, for example, to the intermediate circuit 23 thereof, for providing electrical power to the electrical converter unit 14 and/or for storing electrical energy provided by the electrical converter unit 14 or a further converter or other electrical power source. The elevator 100 may, preferably, comprise an elevator control unit 1100 and/or the control unit 14A such as, or a similar one as, described in connection with FIG. 3.

There may be one or several movers 11 coupled to one or each of the elevator cars 10. Depending on the structure of the electric linear motor 12, such as the number of stator beams 12A, the number of movers 11 may vary.

There may, preferably, be at least two landing floors, having landing floor doors 25 or openings 25, comprised in the elevator 100. There may also be doors comprised in the elevator car 10. Although shown in FIG. 4 that there are two horizontally separated sets, or "columns", of vertically aligned landing floors, there could as well be only one column as in conventional elevators or more than two, for example, three.

Regarding the elevator shaft 13, it may be such as defining substantially closed volume in which the elevator car 10 is adapted and configured to be moved. The walls may be, for example, of concrete, metal or at least partly of glass, or any combination thereof. The elevator shaft 13 herein refers basically to any structure or pathway along which the elevator car 10 is configured to be moved. As can be seen in FIG. 4 with respect to the multi-car elevator 100, the elevator car 10 or cars 10 may be moved along the elevator shaft 13 vertically and/or horizontally depending on the direction of stator beams 12A. According to embodiments similar to one in FIG. 3 in this respect, the elevator car 10 or cars 10 may be configured to be moved along a number of vertical and/or horizontal stator beams, for example, two beams such as in FIG. 4. The stator beams 12A are part of an electric linear motor of the elevator 100 utilized to move the elevator car 10 or cars 10 in the elevator shaft 13. The stator beams 12A may, preferably, be arranged in fixed manner, that is, stationary with respect to the elevator shaft 13, for example, to a wall of the shaft by fastening portions, which may be arranged to rotatable at direction changing positions of the elevator car 10.

In the solution of the invention thermal stress of a power semiconductor switch, such as an IGBT, of an electrical converter unit is reduced. In the solution of the present invention load is measured or determined and based on the measured or determined load and/or a predetermined speed profile required motor current is estimated. The electrical converter unit has at least a first operating state and a second operating state. The second operating state is used if predetermined criteria is fulfilled, the predetermined criteria relating to at least one of the following: estimated required current, measured motor speed, temperature of the power semiconductor switch and/or electrical converter unit, temperature model of the power semiconductor switch and/or electrical converter unit. In the second operating state a lower switching frequency of the power semiconductor switch is used than in the first operating state, and in the second operating state a higher switching speed of the power semiconductor switch is used than in the first operating state.

The second operating state can be used e.g. if motor speed is below certain predetermined threshold value and estimated required current value is above certain predetermined threshold value. In one embodiment of the invention operating state is changed from first state to the second state when drive is started with high load and motor speed is low and/or when motor is decelerated and the motor speed is low and the load is high. In this situation the phase current of the motor is concentrated mostly on one switch of the inverter bridge because motor speed is low.

In one embodiment of the invention the switching speed of the power semiconductor switch is increased by using lower gate resistor value of the power semiconductor switch. In one embodiment of the invention the electrical converter unit comprises a first gate resistor value, a second gate resistor value and means for switching between the first gate resistor value and the second gate resistor value, wherein the first gate resistor value is higher than the second gate resistor value. In one embodiment of the invention the second resistor value is used in the second operating state and the first resistor value is used in the first state.

In one embodiment of the invention switching speed of the power semiconductor switch is increased by increasing gate control voltage of the power semiconductor switch. In one embodiment of the invention the electrical converter unit comprises a first gate control voltage, a second gate control voltage and means for switching between the first gate control voltage and the second gate control voltage, wherein the first gate control voltage is lower than the second gate control voltage. In one embodiment of the invention the first gate control voltage is used in the first operating state, and the second gate control voltage is used in the second operating state.

In the solution of the invention the load can be determined directly or indirectly. The load can be determined e.g. by a scale in an elevator car, in a rope and/or in connection with an attachment point of the rope. Also, a weight sensor can be used in determination of the load. In one embodiment of the invention the load determination can be based on motor torque e.g. when the elevator car is held steady after releasing the brakes.

In one embodiment of the invention the internal temperature of the power semiconductor switch and/or electrical converter unit is measured and/or modelled, and the operating state is changed from the first state to the second state if, in addition to the predefined motor speed and predefined estimated required current value, a certain measured and/or modelled temperature threshold limit is reached. Operating state can be changed back from the second state to the first state when the temperature is under temperature threshold limit.

In one embodiment of the invention the internal temperature of the power semiconductor switch and/or electrical converter unit is measured and/or modelled, the operating state is changed from first state to the second state only if a certain measured and/or modelled temperature threshold limit is reached regardless of the motor speed and estimated required current value. Operating state can be changed back from the second state to the first state when the temperature is under temperature threshold limit.

In one embodiment of the invention temperature determination can be used as criteria for changing the operating mode between the first operating mode and second operating mode. In one embodiment the steps of determining load and estimating required motor current based on the determined load and/or a predetermined speed profile don't have to be carried out. In this embodiment operating state can be changed to the second operating state e.g. if temperature (measured and/or modelled) is higher than a certain temperature limit. In this case e.g. when the motor speed is low, second operating mode can be used. If motor speed is low but the temperature is not over the predefined limit, the system can operate in the first operating state because temperature stress doesn't require the operating mode to be changed.

Figure 5A:
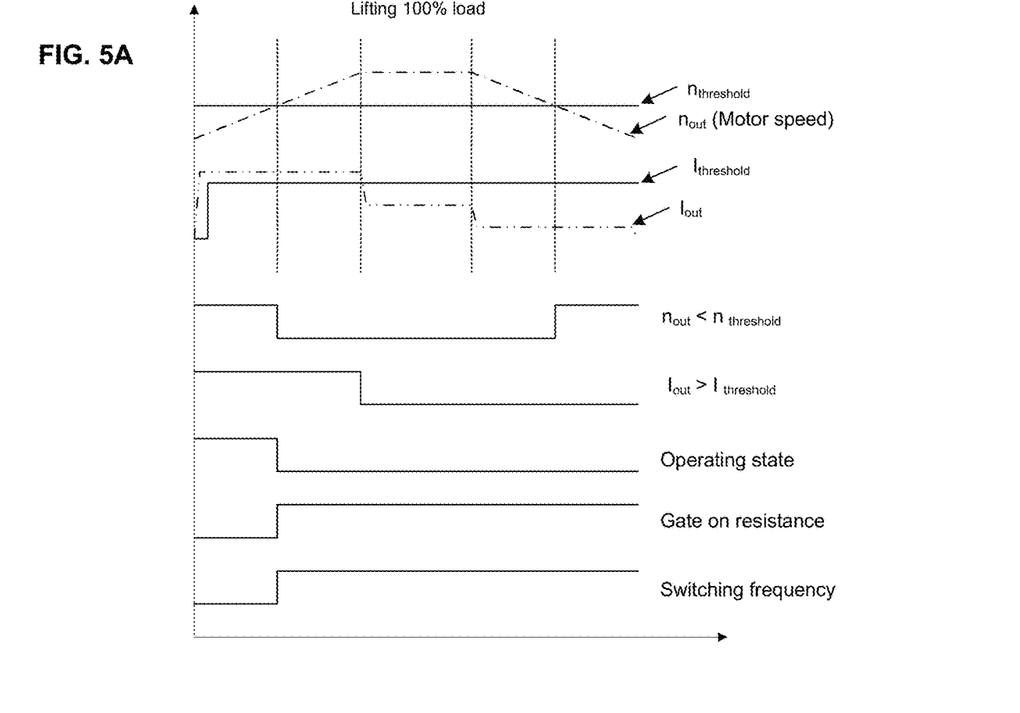
FIGS. 5A and 5B present an example embodiment of how the operating mode can be changed in elevator environment.
Figure 5B:
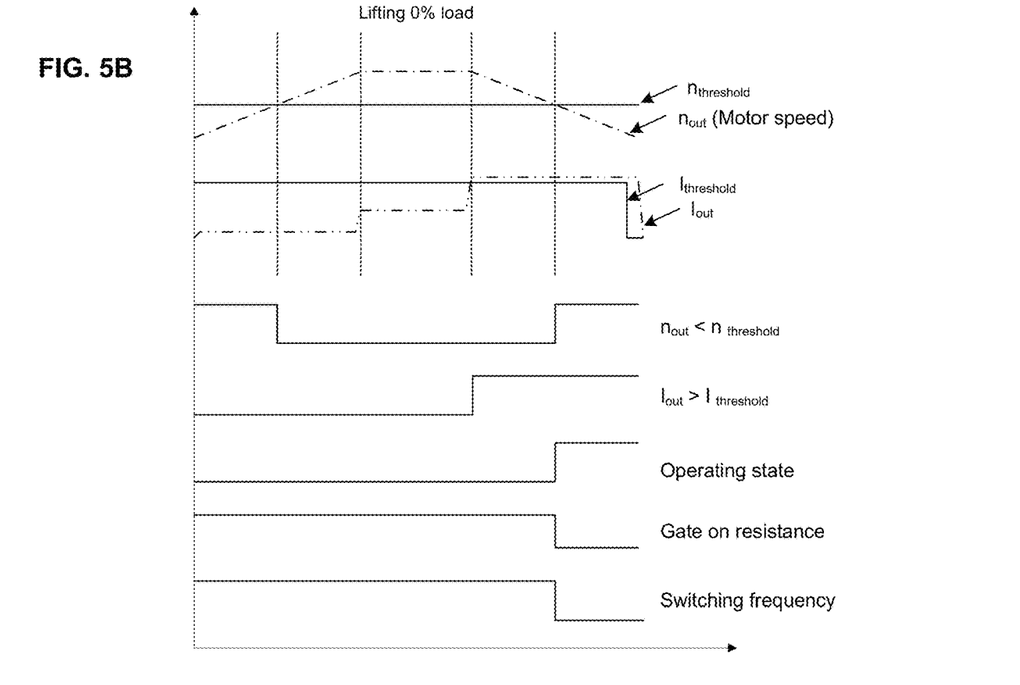

FIGS. 5A and 5B present as an example of how the operating mode can be changed in elevator environment and what kind of information can be utilized in the selection of the operating mode. In this example an elevator having a counterweight is used as an elevator. In these figures motor speed during elevator movement is illustrated in the top of the figure with a threshold level with which temperature stress on the semiconductor switch can be a problem if high current is required. Below the motor speed graph, the required current level is shown with a threshold current level, which is a minimum level of current which can cause stress on the semiconductor switch especially when also motor speed is low. Next two graphs present at which moments of time motor speed is under the threshold value and at which moments of time the required current is over the threshold value. The last three graphs present which operating state is used and whether higher or lower gate resistor value is used and whether higher or lower switching frequency is used.

FIG. 5A presents a case in which elevator car is lifted with a full load. In the beginning high current is required to accelerate the elevator car and at the same time the speed of the motor is low. In this case the operating mode with reduced thermal stress on power semiconductor switches is used. As the speed of the elevator car is increased, also the motor speed is increased, and the operating mode can be changed back to an operating mode having higher switching frequency and slower switching speed because thermal stress of the power semiconductor switch is no longer a problem.

FIG. 5B presents a case in which elevator car is lifted with an empty load. In the beginning of the lifting only low current is required to accelerate the elevator car. In this case an operating mode having higher switching frequency and slower switching speed can be used because the current requirement is low and therefore thermal stress of the power semiconductor switch is not a problem. As the elevator approaches the desired floor, it starts to decelerate, and this deceleration requires also higher current. Also, motor speed is reduced as the elevator is decelerating. In this case when the motor speed is at or under the threshold motor speed value and the required current is at or above the current threshold value, the operating mode is changed to the operating mode with reduced thermal stress on power semiconductor switches so that the stress on the power semiconductor switches could be kept lower.

In one embodiment of the invention change from the first operating state to second operating state can be done when the estimated required current is above the predefined threshold limit and/or motor speed is zero or below certain threshold value. This is the case for example when the motor speed is accelerated from zero for example when a full elevator car is started to be lifted.

In one embodiment of the invention change from the first operating state to second operating state can be done when motor speed is decelerated and motor speed decreases below certain threshold value and estimated required current is over certain predefined threshold limit. This is the case for example when the motor has to brake and decelerate an empty elevator.

In one embodiment of the invention change from the first operating state to second operating state can be done based on measured temperature and/or estimated temperature based on a temperature model if temperature exceeds certain threshold level. In this case estimating required motor current and/or motor speed can be used as additional criteria. In this case operating state is changed only if estimating required motor current, motor speed and temperature fulfill the criteria required for changing the state. In one embodiment of the invention, the operating state can be changed only based on temperature, e.g. regardless of other criteria like estimated required current and motor speed.

In one embodiment of the invention change from the second operating state to first operating state can be done when motor speed exceeds certain predefined threshold limit. This is the case for example when motor speed is increased to a certain speed, e.g. when the elevator reaches certain speed.

In one embodiment of the invention the first operating state can be used when estimated required current is below certain threshold value even if motor speed is zero or below certain threshold value. This is the case for example if motor load stays low, e.g. if half empty elevator car is lifted.

In one embodiment of the invention change from the second operating state to first operating state can be done based on measured temperature and/or estimated temperature based on a temperature model if temperature is below certain threshold level. In this case estimating required motor current and/or motor speed can be used as additional criteria. In this case operating state is changed only if estimating required motor current, motor speed and temperature fulfill the criteria required for changing the state. In one embodiment of the invention, the operating state can be changed only based on temperature, e.g. regardless of other criteria like estimated required current and motor speed.

Figure 6A:
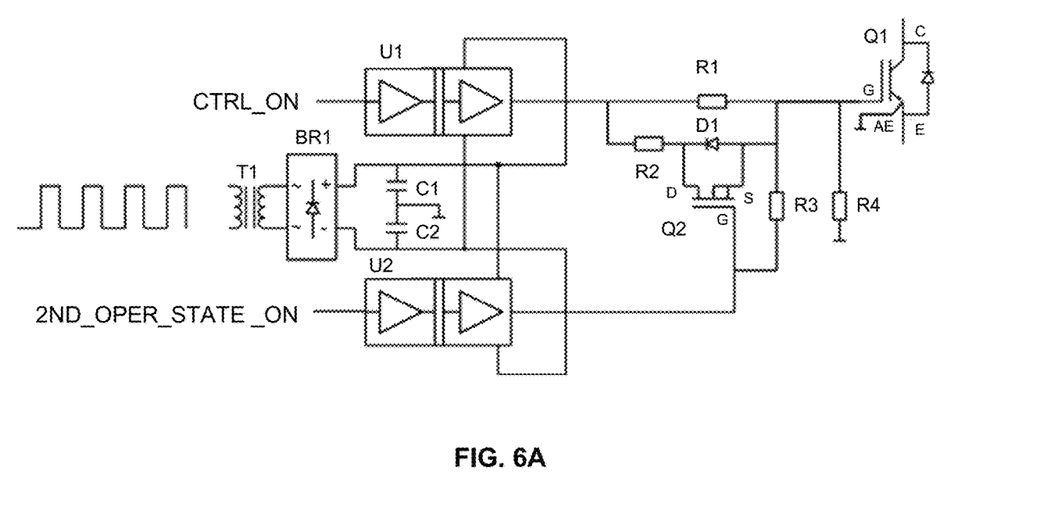
FIGS. 6A and 6B illustrate schematically certain parts of the electrical converter units according to some embodiments of the present invention.
Figure 6B:
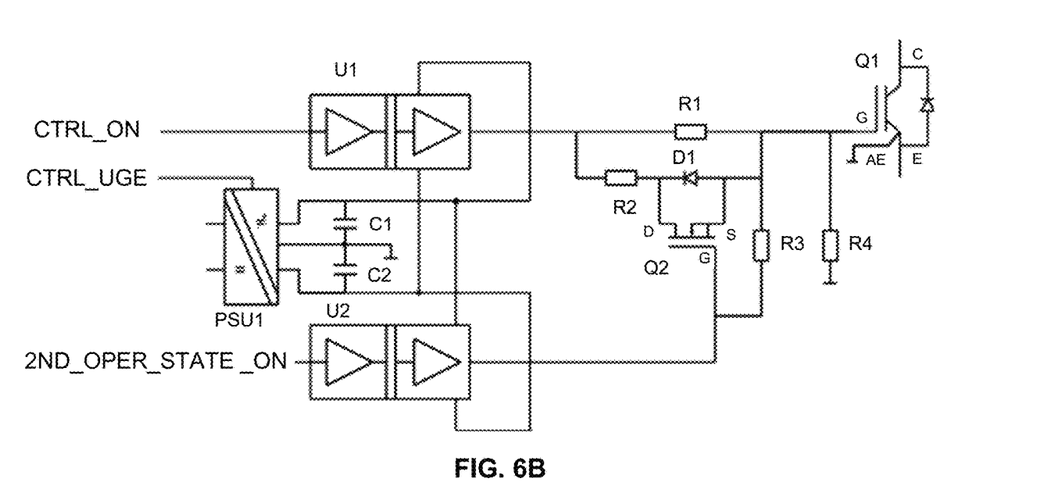

The solution of the present invention can be implemented in many different ways in electrical converter unit. FIGS. 6A and 6B illustrate schematically driver circuits of electrical converter units as example implementation embodiments.

In the example embodiment of FIG. 6A the reduced switching time of the IGBT Q1 is implemented by using a field-effect transistor Q2, having its drain connected to a first pole of the turn-off gate resistor R2. The source pole of the field-effect transistor Q2 is connected to the gate G of the IGBT Q1 to be controlled. The second pole of the turn-off gate resistor R2 is connected to the output U1 of the main gate controller. The gate of field-effect transistor Q2 is connected to an output of a separate auxiliary gate controller U2. A discharging resistor R3 can be connected between the gate and the source of the field-effect transistor Q2. A discharging resistor R4 can be connected between the gate and the auxiliary emitter of the IGBT to be controlled. The current output capacity of auxiliary emitter is dimensioned based on field-effect transistor Q2 for which only a reasonably low current is required for turn-on.

In this example the separated two-level control voltage, e.g. +15V/−15V, can be generated in a conventional way by rectifying dc square wave with a diode bridge BR1. The rectified voltage can be filtered by capacitors C1 and C2, whose center poles are grounded to auxiliary emitter AE of the IGBT to be controlled.

When a CTRL_ON-signal is active and 2ND_OPER_STATE_ON is non-active, +15V control voltage is directed to the gate of the IGBT via gate resistor R1. When CTRL_ON-signal is active and 2ND_OPER_STATE_ON is active, +15V control voltage is directed to the gate of the IGBT via gate resistor R1 and the series connection of the auxiliary gate resistor R2 and the field-effect transistor Q2 connected in parallel with gate resistor R1. Thus, the current supplied from the output U1 of the main gate controller is divided between the gate resistor R1 and the auxiliary gate resistor R2.

When the IGBT Q1 is controlled to be turned off, the CTRL_ON-signal is non-active and 2ND_OPER_STATE_ON-signal is non-active, and gate charge is discharged via gate resistor R1 and parasitic diode of field effect transistor Q2 and auxiliary gate resistor R2. When CTRL_ON-signal is non-active and 2ND_OPER_STATE_ON is active, gate charge of IGBT is discharged via an opened channel of field effect transistor Q2 and gate resistor R1 and auxiliary gate resistor R2.

Control signals CTRL_ON and 2ND_OPER_STATE_ON can be at the voltage potential of the control voltage. 2ND_OPER_STATE_ON can be adjusted separately to each switch of the inverter and/or at the same time for all switches. CTRL_ON control signal is a separate signal for every switch of the inverter.

The example embodiment of FIG. 6B is otherwise similar as the previous example but an adjustable DC-DC converter PSU1 is added to the circuit, in which case a higher-level control system can change the control voltage instruction with a CTRL_UGE-control signal. DC-DC converter PSU1 adjusts and regulates the two-level control voltage based on the instructions it receives.

The control voltage level adjustment feature described here relating to FIG. 6B can be implemented without selectable gate resistor values of the previous example or it can be implemented in addition to a solution which has selectable gate resistor values, e.g. as presented in the FIG. 6A.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A method for reducing thermal stress of a power semiconductor switch, such as an IGBT, of an electrical converter unit, the electrical converter unit comprising at least a gate control circuit wherein the electrical converter unit controls an electrical motor, wherein the method comprises:

determining load,
estimating required motor current based on the determined load and/or a predetermined speed profile,
wherein the electrical converter unit has at least a first operating state and a second operating state,
wherein the second operating state is used if predetermined criteria is fulfilled, the predetermined criteria relating to at least one of the following: estimated required current, measured motor speed, temperature of the power semiconductor switch and/or electrical converter unit, temperature model of the power semiconductor switch and/or electrical converter unit,
wherein in the second operating state a lower switching frequency of the power semiconductor switch is used than in the first operating state, and
in the second operating state a higher switching speed of the power semiconductor switch is used than in the first operating state.

2. A method according to claim 1, wherein the second operating state is used if motor speed is below certain predetermined threshold value and estimated required current value is above certain predetermined threshold value.

3. A method according to claim 2, wherein the internal temperature of the power semiconductor switch and/or electrical converter unit is measured and/or modelled, and the operating state is changed from first state to the second state if in addition to the predefined motor speed and predefined estimated required current value, a certain measured and/or modelled temperature threshold limit is reached.

4. A method according to claim 1, wherein the internal temperature of the power semiconductor switch and/or electrical converter unit is measured and/or modelled, the operating state is changed from first state to the second state only if a certain measured and/or modelled temperature threshold limit is reached regardless of the motor speed and estimated required current value.

5. A method according to claim 1, wherein the operating state is changed from first state to the second state when drive is started with a load higher than a predefined load value and motor speed is low, e.g. below a predefined speed, and/or when motor is decelerated and the motor speed is low, e.g. below a certain predefined speed.

6. A method according to claim 1, wherein the electrical converter unit comprises a first gate resistor value, a second gate resistor value and means for switching between the first gate resistor value and the second gate resistor value, wherein the first gate resistor value is higher than the second gate resistor value.

7. A method according to claim 1, wherein the switching speed of the power semiconductor switch is increased by using lower gate resistor value of the power semiconductor switch.

8. A method according to claim 6 wherein the second resistor value is used in the second operating state and the first resistor value is used in the first state.

9. A method according to claim 1, wherein the electrical converter unit comprises a first gate control voltage, a second gate control voltage and means for switching between the first gate control voltage and the second gate control voltage, wherein the first gate control voltage is lower than the second gate control voltage.

10. A method according to claim 1, wherein switching speed of the power semiconductor switch is increased by increasing gate control voltage of the power semiconductor switch.

11. A method according to claim 9, wherein the first gate control voltage is used in the first operating state, and the second gate control voltage is used in the second operating state.

12. A method according to claim 1, wherein the electric motor is an elevator motor of an elevator.

13. A method according to claim 1 wherein the electric motor is one of the following: a synchronous reluctance motor, a permanent magnet motor, a permanent magnet linear motor, a permanent magnet assisted synchronous reluctance motor, a linear switched reluctance motor.

14. An electrical converter unit comprising at least a power semiconductor switch, such as an IGBT, and a gate control circuit, wherein the electrical converter unit is configured to control an electrical motor, wherein the electrical controller unit is configured:
to determine load,
to estimate required motor current based on the determined load and/or a predetermined speed profile,
wherein the electrical converter unit has at least a first operating state and a second operating state,
wherein the electrical converter unit is configured to use the second operating state if predetermined criteria is fulfilled, the predetermined criteria relating at least one of the following: to estimated required current, measured motor speed, temperature of the power semiconductor switch and/or electrical converter unit, temperature model of the power semiconductor switch and/or electrical converter unit,
wherein the electrical converter unit is configured to use a lower switching frequency of the power semiconductor switch in the second operating state than in the first operating state, and
a higher switching speed of the power semiconductor switch in the second operating state than in the first operating state.

15. An electrical converter unit according to claim 14, wherein the electrical converter unit is configured to use the second operating state if motor speed is below certain predetermined threshold value and estimated required current value is above certain predetermined threshold value.

16. An electrical converter unit according to claim 15, wherein the electrical converter unit 1 is configured to measure and/or model the internal temperature of the power semiconductor switch and/or electrical converter unit, and change the operating state from first state to the second state if, in addition to the predefined motor speed and predefined estimated required current value, a certain measured and/or modelled temperature threshold limit is reached.

17. An electrical converter unit according to claim 14, wherein the electrical converter unit is configured to measure and/or model the internal temperature of the power semiconductor switch and/or electrical converter unit, and change the operating state from first state to the second state only if a certain measured and/or modelled temperature threshold limit is reached regardless of the motor speed and estimated required current value.

18. An electrical converter unit according to claim 14, wherein the electrical converter unit is configured to change the operating state from the first state to the second state when drive is started with a load higher than a predefined load value and motor speed is low, e.g. lower than a predefined speed, and/or when motor is decelerated and the motor speed is low, e.g. lower than a predefined speed.

19. An electrical converter unit according to claim 14, wherein the electrical converter unit comprises a first gate resistor value, a second gate resistor value and means for switching between the first gate resistor value and the second gate resistor value, wherein the first gate resistor value is higher than the second gate resistor value.

20. An electrical converter unit according to claim 14, wherein the electrical converter unit is arranged to increase the switching speed of the power semiconductor switch by using lower gate resistor value of the power semiconductor switch.

21. An electrical converter unit according to claim 19 wherein the electrical converter unit is configured to use the second resistor value in the second operating state and the first resistor value is used in the first state.

22. An electrical converter unit according to claim 14, wherein the electrical converter unit comprises a first gate control voltage, a second gate control voltage and means for switching between the first gate control voltage and the second gate control voltage, wherein the first gate control voltage is lower than the second gate control voltage.

23. An electrical converter unit according to claim 14, wherein the electrical converter unit is configured to increase switching speed of the power semiconductor switch by increasing gate control voltage of the power semiconductor switch.

24. An electrical converter unit according to claim 22, wherein the electrical converter unit is configured to use the first gate control voltage in the first operating state, and the second gate control voltage in the second operating state.

25. An electrical converter unit according to claim 14, wherein the electric motor is an elevator motor of an elevator.

26. An electrical converter unit according to claim 14 wherein the electric motor is one of the following: a synchronous reluctance motor, a permanent magnet motor, a permanent magnet linear motor, a permanent magnet assisted synchronous reluctance motor, a linear switched reluctance motor.

27. The electrical converter unit according to claim 14 wherein the electrical converter unit comprises a converter device, such as a frequency converter.

28. An elevator comprising
an elevator car,
an elevator motor configured to move the elevator car,
an electrical converter unit for operating the elevator motor, and
a control unit configured to control the elevator and/or the electrical converter unit,
wherein:
the electrical converter unit is an electrical converter unit according to claim 14.

* * * * *